(12) United States Patent
Britton et al.

(10) Patent No.: US 8,354,662 B2
(45) Date of Patent: Jan. 15, 2013

(54) SEMICONDUCTING NANOPARTICLES WITH SURFACE MODIFICATION

(75) Inventors: David Thomas Britton, Cape Town (ZA); Margit Härting, Cape Town (ZA)

(73) Assignee: PST Sensors, Ltd., Cape Town (ZA)

( * ) Notice: Subject to any disclaimer, the term of this patent is extended or adjusted under 35 U.S.C. 154(b) by 897 days.

(21) Appl. No.: 11/922,790

(22) PCT Filed: Jun. 29, 2006

(86) PCT No.: PCT/IB2006/001788
§ 371 (c)(1),
(2), (4) Date: Apr. 18, 2008

(87) PCT Pub. No.: WO2007/004014
PCT Pub. Date: Jan. 11, 2007

(65) Prior Publication Data
US 2010/0148144 A1    Jun. 17, 2010

(30) Foreign Application Priority Data
Jun. 30, 2005   (ZA) .................................. 2005/05300

(51) Int. Cl.
*H01L 29/66* (2006.01)
(52) U.S. Cl. ...... 257/9; 257/500; 257/512; 257/E29.168
(58) Field of Classification Search ............ 257/9, 500, 257/512, E29.168
See application file for complete search history.

(56) References Cited

U.S. PATENT DOCUMENTS

| 6,344,272 | B1 | 2/2002 | Oldenburg et al. |
| 6,710,366 | B1 | 3/2004 | Lee et al. |
| 7,666,513 | B2 * | 2/2010 | Boyle et al. .................. 428/446 |
| 2003/0034486 | A1 | 2/2003 | Korgel et al. |
| 2003/0102793 | A1 | 6/2003 | Komoda et al. |
| 2004/0229447 | A1 | 11/2004 | Swihart et al. |

FOREIGN PATENT DOCUMENTS

| WO | WO 99/27584 | 6/1999 |
| WO | WO 2004/068536 A2 | 8/2004 |

OTHER PUBLICATIONS

Ledoux, G. et al., "Effect of Passivation and Aging on the Photoluminescence of Silicon Nanocrystals," Applied Physics Letters, vol. 79, No. 24, pp. 4028-4030, 2001.
Yu et al., "Structural Properties of Hydrogenated Silicon Nanocrystals and Nanoclusters," Journal of Applied Physics, vol. 92, No. 12, pp. 7453-7458, 2002.
International Search Report mailed Mar. 20, 2007 for Application Serial No. PCT/IB2006/001788.

* cited by examiner

*Primary Examiner* — Long Pham

(57) ABSTRACT

The invention relates to semiconducting nanoparticles. The nanoparticles of the invention comprise a single element or a compound of elements in one or more of groups II, III, IV, V, VI. The nanoparticles have a size in the range of 1 nm to 500 nm, and comprise from 0.1 to 20 atomic percent of oxygen or hydrogen. The nanoparticles are typically formed by comminution of bulk high purity silicon. One application of the nanoparticles is in the preparation of inks which can be used to define active layers or structures of semiconductor devices by simple printing methods.

36 Claims, 3 Drawing Sheets

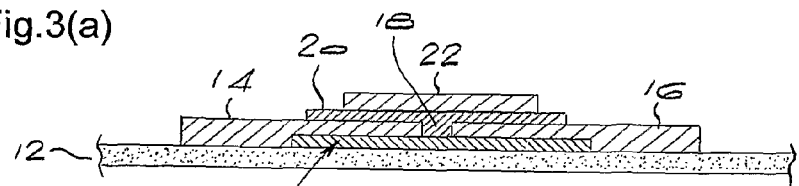
Fig.3(a)
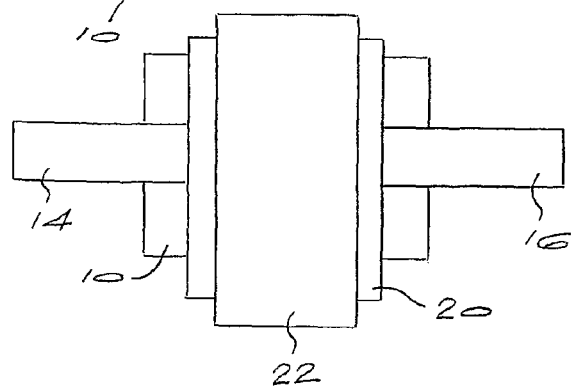
Fig.3(b)
Fig.4
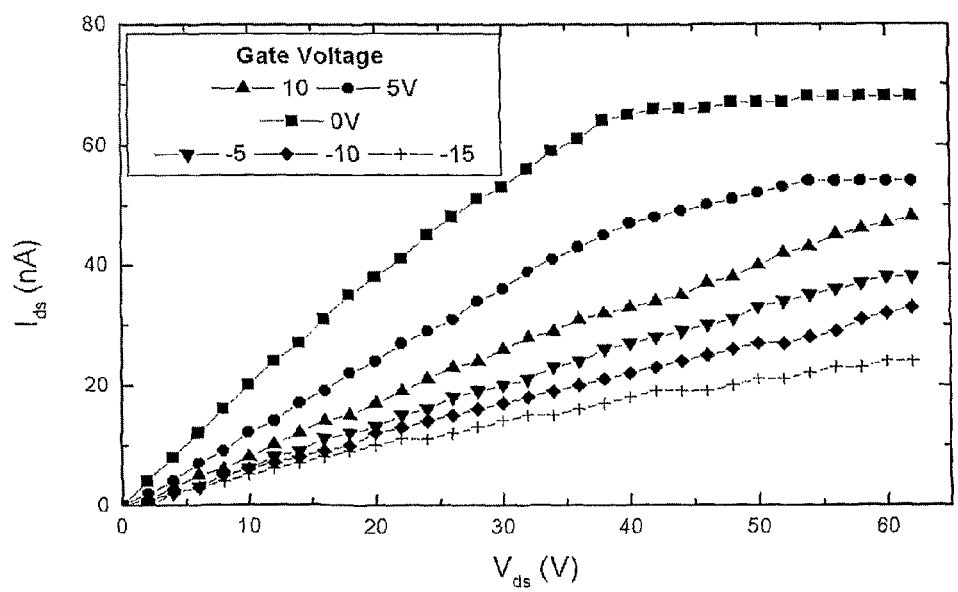

SEMICONDUCTING NANOPARTICLES WITH SURFACE MODIFICATION

BACKGROUND OF THE INVENTION

This invention relates to nanoparticles with semiconducting properties which can be used in electronic and electrical applications in general, and particularly in those applications requiring semiconducting properties.

Semiconductor nanoparticles, with a characteristic size of a few nanometres up to several hundred nanometres, are a widely studied type of material, in which size effects dominate over properties of the bulk material. In general, depending on the specific material and its application, three different size-related phenomena may change the electronic, optical, thermal and mechanical properties of the nanoparticles:

1. a different structure and composition compared to the known bulk phases;
2. a higher surface to volume ratio, causing surface states and processes to dominate; and
3. quantum confinement effects when the size of the object is similar to or smaller than the wavelength and coherence length of a fundamental excitation (electronic state, optical wavelength or phonon excitation).

It is also understood that bare, unterminated silicon surfaces are only stable under ultra high vacuum conditions. The above issues, and a perception that nanotechnology is an expensive, high technology option, requiring complex synthesis and handling techniques, has limited the adoption of such technology for practical electrical and electronic devices.

It is an object of the invention to provide nanoparticles suitable for use, in particular, in electrical and electronic applications, as well as devices for such applications.

SUMMARY OF THE INVENTION

According to the invention there are provided nanoparticles comprising a single element or a compound of elements in one or more of groups II, III, IV, V, and VI, the nanoparticles having semiconducting properties, a size in the range of 1 nm to 500 nm, and comprising from 0.1 to 20 atomic percent of a substituent selected from the group comprising oxygen and hydrogen.

The term "semiconducting properties" in this specification means the transport of charge carriers, specifically electrons and/or holes, onto, off and through the particle. The flow of charge may be through the body of the particle or be restricted to the surface region thereof, and may occur between two adjacent particles or between a particle and an external electrical connection.

Preferably, the nanoparticles have a size in the range of 30 nm to 200 nm.

In one preferred embodiment, the nanoparticles may have an average diameter of 60 nm.

In another preferred embodiment, the nanoparticles have a relatively large distribution of sizes in the range from several tens of nm to 400 nm, with a median maximum dimension of 200 nm.

In a further preferred embodiment, the nanoparticles may have an average size of approximately 100 nm.

The nanoparticles may comprise intrinsic silicon. In a preferred embodiment, the silicon may be metallurgical grade silicon, for example having a purity of 98%.

Alternatively, the nanoparticles may comprise doped silicon.

The silicon may be doped with a group V or VI element such as antimony or phosphorous, and have n-type properties.

Alternatively, the silicon may be doped with a group II or III element such as boron, and have p-type properties.

Alternatively, the nanoparticles may comprise, inter alia, Ge, GaAs, AlGaAs, GaN, InP, SiC, and SiGe alloys.

The substituent comprising oxygen or hydrogen may be located at the surface of each nanoparticle.

The surface of each nanoparticle may be either wholly or partially covered by an oxide of at least one of the elements of which the nanoparticle is comprised.

The oxide effectively defines a passivation layer at the surface of the nanoparticles.

The oxide may be either native oxide, or thermally or chemically synthesised oxide, which may be modified so as to allow the transport of electrical charge through it.

For example, the oxide may be etched to reduce its thickness and/or to increase its porosity.

Alternatively, a substance may be included in the oxide during synthesis thereof to give the oxide semiconducting properties.

Thus surface passivation in the present invention is to be seen as a chemical process to produce a stable particle structure, and not electrical passivation as required for luminescent particles, for example. There is neither an insulating barrier to charge transport, (which is known to be achieved by a thick oxide coating) nor saturated (complete) trapping of charge carriers to localised states.

The surface of each nanoparticle may be partially or fully terminated with oxygen or hydrogen. Alternatively, the surface of each nanoparticle may be partially or fully terminated with hydroxyl (OH) groups.

It is possible that the surface of each nanoparticle may be partially or fully terminated with a combination of oxygen, hydrogen and hydroxyl groups.

Further according to the invention there is provided a printable composition comprising nanoparticles as defined above and a binder.

The binder may be an inorganic binder, which may be conducting, semiconducting or insulating.

Alternatively, the binder may be a polymer binder, which may be conducting, semi-conducting or insulating.

Further alternatively, the binder may be a chemically active binder having constituents which react with the material of the nanoparticles to provide the semiconducting properties thereof.

Still further according to the invention there is provided a composite material comprising nanoparticles as defined above, and a solid matrix in which the nanoparticles are dispersed.

The nanoparticles may be dispersed randomly or in a regular arrangement in the matrix.

Still further according to the invention, there is provided a composite material comprising nanoparticles as defined above, in which the nanoparticles form an interconnecting network or compact body.

The invention extends to an active semiconducting layer or structure incorporating nanoparticles as defined above and a printable composition as defined above or a composite material as defined above.

The invention further extends to a semiconducting device, component or circuit element including at least one such semiconducting layer or structure.

The invention further extends to an electrical or electronic circuit or assembly of electronic components which includes at least one such semiconducting device.

According to a further aspect of the invention there is provided a method of manufacturing nanoparticles, the method including the steps of comminuting a feedstock material comprising a single element or a compound of elements in one or more of groups II, III, IV, V, and VI in the presence of oxygen and/or hydrogen to produce nanoparticles having n-type or p-type semiconducting properties, a size in the range of 1 nm to 500 nm, and comprising from 0.1 to 20 atomic percent of a substituent selected from the group comprising oxygen and hydrogen.

In preferred embodiments of the invention, the feedstock material comprises doped or intrinsic silicon.

Preferably, the comminution of the feedstock material is carried out in the presence of air.

BRIEF DESCRIPTION OF THE DRAWINGS

FIGS. 3(a) & 3(b) are side and plan views of an insulated gate (metal insulator semi-conductor) field effect transistor containing nanoparticulate semiconductor layers and a polymer dielectric according to the invention;

FIG. 4 is a graph showing source-drain characteristics of the transistor of FIGS. 3(a) and 3(b) fabricated according to the method of Example 1.

DESCRIPTION OF EMBODIMENTS

Figure 1:
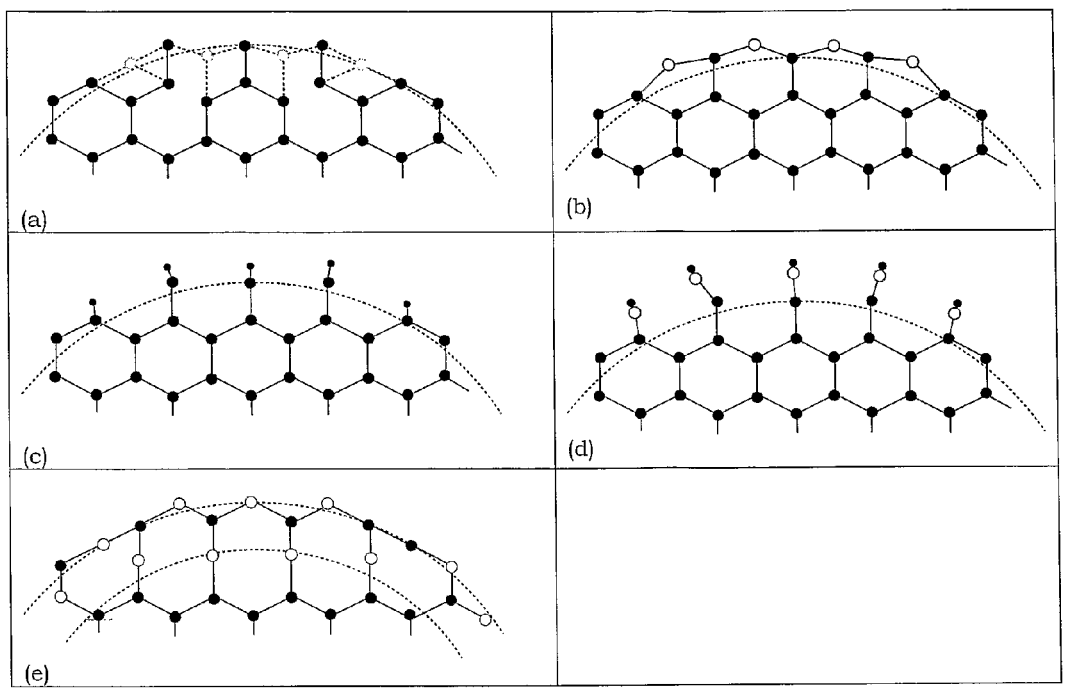
FIGS. 1(a) to 1(e) are schematic representations of a single crystalline silicon nanoparticle showing a cross-section through the (111) crystallographic plane showing different possible surface modification, including (a) an unterminated surface; (b) an oxygen terminated surface; (c) a hydrogen terminated surface; (d) a hydroxyl terminated surface; and (e) an oxide surface.

The invention, as described and exemplified below, concerns the use of nanoparticles having semiconducting properties in electronic and electrical applications in general, and specifically in those applications where semiconducting properties are required. The nanoparticles are preferably formed of intrinsic or doped silicon, although other elemental or compound semiconductor materials, including amongst others Ge, GaAs, AlGaAs, GaN, InP, SiC, and SiGe alloys, can be used.

In basic scientific studies a stable, well characterised surface is required for nanoparticles, which has led to nanotechnology being seen as an expensive, high technology option, requiring complex synthesis and handling techniques. Bare, undecorated silicon surfaces are only stable under ultra high vacuum conditions. Many nanoparticles produced by wet chemical synthesis, e.g. silicon particles such as those described by Baldwin et al (Chemical Communications 1822 (2002)) are terminated with long alkyl chains, which act as a surfactant to prevent aggregation and the growth of larger particles.

With the exception of hydrogen termination resulting from wet chemical synthesis of silicon quantum dots, reported by Liu and Kauzlarich (Materials Science & Engineering B 96 72-75 (2002)), the natural surface modifications of elemental and compound semiconductors, involving oxygen and hydrogen, have been avoided. This is despite their use in conventional semiconductor processing. Hydrogen passivation, usually achieved via a hydrofluoric acid dip, is an important intermediate step in silicon device manufacture. Thermal and native oxide layers remain the basis of most dielectrics in silicon technology. However, in nanoparticle applications, oxides generally only occur as the semiconducting particles themselves, as in dye solar cells, or as a crystalline or vitreous silica matrix or encapsulation. Encapsulation with a thick oxide has been applied to electrically passivate luminescent particles, thus stabilising their light emitting properties (Korgel, U.S. Pat. No. 6,918,946) and additionally as an etching process to control the size of the silicon core (Swihart, US2004/0229447). As far as the electronic properties of nanoparticles are concerned, however, exposure to both air and moisture, and thus oxidation and hydration processes, has been systematically avoided.

Importantly, and by contrast, in the present invention the surface of the nanoparticles is modified by the presence of oxygen, hydrogen, or a mixture of both, in such a way as to maintain, albeit in a modified form, the semiconducting functionality of the particle. The surface hydrogen and oxygen may be present in the form of a thin native oxide, or as bridging oxygen groups, hydroxyl groups, and hydrogen, as shown in FIGS. 1(b) to (e).

The drawings of FIGS. 1(a) to (e) are schematic representations of a crystalline silicon nanoparticle, showing a cross section through the (111) crystallographic plane for different possible surface modifications. Only three of the four silicon bonds are shown, the forth being perpendicular out of the plane of the drawing. The dashed curve indicates the approximate free surface of the particle.

FIG. 1(a) shows a nanoparticle with an unterminated, but reconstructed silicon surface. The grey circles represent additional silicon atoms, and the broken lines represent additional bonds to these atoms. The structure is highly strained, and such surfaces are generally unstable except in ultra high vacuum.

FIG. 1(b) shows a nanoparticle with an oxygen terminated surface. The white circles represent oxygen atoms, each having two bonds to unterminated silicon atoms.

FIG. 1(c) shows a nanoparticle with a hydrogen terminated surface, with hydrogen atoms shown as smaller black circles.

FIG. 1(d) shows a nanoparticle with a hydroxyl terminated surface, with hydroxyl groups occupying unterminated silicon bonds. The silicon structure is not distorted, and this surface is expected to be stable.

FIG. 1(e) shows a thin layer of amorphous silicon oxide at the surface of the nanoparticle, in the region shown between the two curved broken lines. In this case the oxide layer is approximately one monolayer thick.

On bulk silicon surfaces thermal oxides may be tens, or even hundreds, of microns thick, and depending on temperature and humidity, the native oxide normally grows to a thickness of 5-10 nm. A layer this thick would obviously insulate any nanoparticle and dominate its electrical properties. In the present invention use is made of the inventors' observations that oxidation in nanoparticles comprising the relevant element(s) and within the defined size range is self limiting, at one monolayer or less, and forms a stable surface. These observations are supported by several basic scientific studies in the literature on the oxidation of nanostructured silicon, e.g. Okada et al (Appl. Phys. Lett. 58 (15), 15 Apr. 1991, pp 1662-1663) and Ostraat et al (Solid State Sciences 7 (2005) pp 882-890), although to date this knowledge has only been applied to the development of synthesis techniques for thick silicon oxides.

Electrical conductivity can occur unhindered between interconnecting particles, as also observed by Ostraat et al in directly deposited layers of silicon nanoparticles. However, these authors attributed the electrical conductivity to the absence of oxide, yielding a direct silicon-silicon connection, at the junctions between the particles and the interface to the substrate, which are protected from the external environment. In the present invention, which concerns free nanopowders—produced in Examples 2 and 3 below by mechanical attrition in air—such a situation is unlikely, and we must conclude that the surface termination itself allows the passage of electrical charge.

The presence of oxygen, or oxide, may provide preferential adsorption sites for hydroxyl (—OH), hydrogen (—H) and alkyl groups (—$(CH_2)_nH$), although these adsorb readily onto unterminated silicon and other semiconductor surfaces, and may therefore form a competing surface modification. All these groups, including oxygen, terminate dangling bonds, preventing localised states forming in the band gap and at the surface. For disperse particles, they may also act as a surfactant, and further stabilise the surface.

In a composite material, such as an ink, or similar composition, produced from nanoparticles with a binder, the surface groups may interact with the binder to achieve either dispersion or agglomeration of the particles. In cases where an interconnecting network of particles is required, the surface modifications should not inhibit the transfer of electrical charge between adjacent particles. Charge transport, may however be modified by conduction via surface states.

For general nanotechnology applications, particles should be in the size range of 1 to 500 nm, but for the exemplary applications presented here, a size from 30 to 200 nm is preferable. In general, the nanoparticles should be large enough to have clearly definable core and surface regions, but small enough to have distinctly different properties from bulk material. In the case of crystalline silicon, at the lower limit of 1 nm diameter 60% of all atoms would occupy surface sites, while micron scale particles would have a bulk-like structure and develop thick oxides. It the present case it is also preferred to avoid single quantum states, at the 10 nm scale, but nevertheless to keep the particles small enough to have a significant surface contribution. Also, larger particles are also less suitable for packing into a compact layer of interconnecting particles.

Additional benefits arise from health, safety, and handling issues, which may impact on the cost-effectiveness, or even suitability, of any industrial process for manufacturing or using the nanoparticles. According to studies by the German National Research Centre for Environment and Health (GSF), presented by J. Heyder at the 2003 UK Institute of Physics Mayneord Phillips Summer School, particles in the 100 nm range are least likely to be deposited in the human respiratory tract. Particles less than about 10 nm in size can be absorbed through the skin and most cell membranes. Larger particles, in the micron range, are more likely to be encapsulated in tissue.

The following examples illustrate various properties and advantages of the invention.

EXAMPLE 1

A semiconducting ink was prepared from a commercially available intrinsic silicon nanopowder from MTI Crystals Corp. The initial powder is produced by laser decomposition of silane gas, in an oxygen free environment. This is normally shipped in a dry nitrogen atmosphere with a guaranteed oxygen concentration of 1 to 2%. The hydrogen concentration is not specified, and no other impurities are detected.

The manufacturers state, in their certificate of analysis, that "Silicon nanopowder is very sensitive to air. Powder must be opened, stored, and operated in inert gas environmental to avoid explosion and $O_2$ contamination." They further recommend that to eliminate oxygen "the powder be roasted for one hour at 120° C. in vacuum or nitrogen". The present inventors have, nevertheless, determined that exposure to ambient air yields a stable powder with the desired oxygen and hydrogen surface termination, suitable for use in a nanoparticulate semiconductor composite with an organic polymer binder. Polystyrene and cellulose acetate butyrate (CAB) are examples of polymers which have been successfully used as binders, using various solvents, including chloroform.

Accordingly, the silicon nanopowder was exposed to air and the hydrogen and oxygen concentration in the nanopowder were determined from time to time by elastic recoil detection analysis (ERDA) and Rutherford backscattering respectively. In the first few hours after exposure to air the hydrogen and oxygen concentrations were 1 and 2 atomic % respectively. After one week, these had stabilised to 1.2 atomic % hydrogen and 5 atomic % oxygen. X-ray diffraction showed the particles to be crystalline silicon, with no crystalline oxide.

Printed layers, produced using the above described Si nanopowder and different inert binders, all showed light n-type conductivity as seen by Hall effect measurements, although the powder as supplied is nominally intrinsic. Scanning electron microscopy of the printed layers indicates that the particles form a network of interconnecting clusters, with a fractal geometry.

Figure 2:
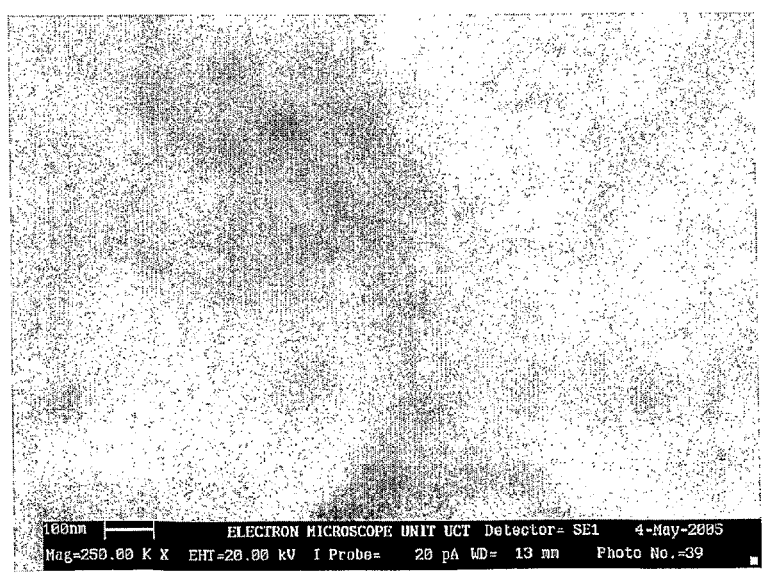
FIG. 2 is a scanning electron micrograph of a printed nanoparticulate silicon composite showing an interconnected network of nanoparticles which has a fractal geometry.
Figure 5:
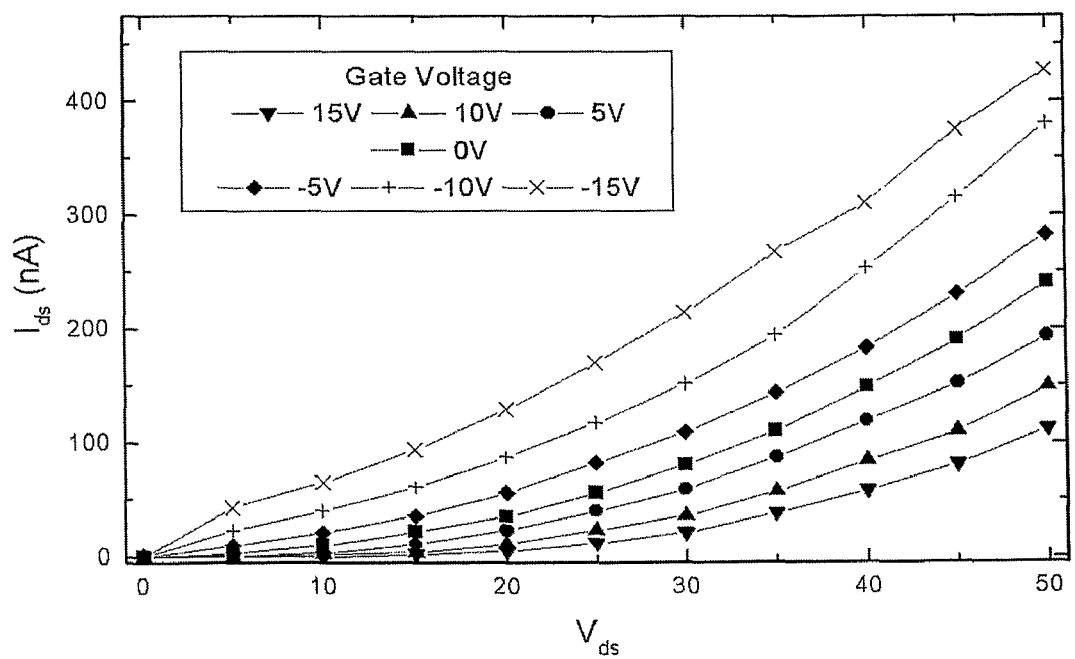
FIG. 5 is a graph showing source-drain characteristics of a similar transistor fabricated according to the method of Example 2.

As shown in the scanning electron micrograph of FIG. 2, the individual particles are spherical with an average diameter of 60 nm. Near-spherical clusters form with diameters of several hundred nanometres, a few microns, and several tens of microns. Energy dispersive X-ray fluorescence shows the average oxygen concentration to be approximately 5%, with a higher fraction at the surfaces of the clusters. At a diameter of 60 nm, 5% oxygen in the form of an oxide surface would have a thickness of 2.5 Angstroms.

The ink described above was used to print simple junction field effect transistors and photodiodes, according to the method described in International patent application WO 2004/068536. The electrical characteristics of the devices were consistent with the properties of the material determined above.

An example of an electronic device incorporating the above techniques and materials is a hybrid inorganic/organic insulated gate field effect transistor, as shown in FIGS. 3(*a*) and (*b*). The device comprises an active nanoparticulate semiconductive layer 10 printed on a paper substrate 12. Printed silver ink source and drain contacts 14 and 16 overlap the layer 10 and define a central gate region 18 between their adjacent innermost ends. A gate insulator or dielectric layer 20 is printed over the inner ends of the source and drain contacts and the central area of the semiconducting layer 10, and a silver ink gate contact 22 is printed onto the dielectric layer 20, avoiding the semiconducting layer 10 and the source and drain contacts. The resulting device is an insulated gate (metal insulator semiconductor) field effect transistor or MISFET.

The semiconductive layer 10 comprises the above mentioned Si powder in a CAB binder with chloroform as a solvent. The gate dielectric in this case is a printed layer of CAB, and the metal contacts are printed silver 5000 conductor from Du Pont Microcircuit Materials.

The source-drain characteristics of a MISFET fabricated as described above are shown in FIG. 4.

EXAMPLE 2

A second example of nanoparticles with a semiconducting functionality, as defined above, concerns nanoparticulate silicon produced by mechanical attrition of Czochralski-grown doped single crystalline Si wafers. These were milled, in an orbital pulveriser, at high speed for one hour in air, without prior removal of the native oxide on the wafers. A high oxygen concentration is therefore expected, although this remains to be confirmed. The resulting particles were irregular in form, with a large distribution of sizes, ranging from several tens of nanometres to 400 nm, with a median maximum dimension of 200 nm. Particles with the median size were separated by centrifuge and settling from a suspension in ethanol.

After drying in air, inks were produced from both antimony doped n-type and boron doped p-type silicon nanopowder, using CAB and chloroform as the binder and solvent respectively, in the same way as for Example 1. Hall effect measurements showed that the n- or p-type conductivity is maintained, with slight modification of the carrier mobility compared to bulk silicon. The inks so described have primarily been used to print the semiconductor layer in insulated gate field effect transistors and photodiodes. Source-drain curves for a similar transistor design to that shown in FIG. 3, but using p-type silicon nanopowder, are shown in FIG. 4.

EXAMPLE 3

A third example of nanoparticles with a semiconducting functionality, as defined above, concerns nanoparticulate silicon produced by mechanical attrition of 98% purity metallurgical grade silicon provided by Silicon Smelters (Pty) Ltd, of Polokwane, South Africa. The silicon feedstock was milled for 5 days in a rotary ball mill in air, using 15 mm diameter yttrium stabilized ziroconia grinding media (supplied by Inframat Inc), and ethanol as a lubricant. The resulting particle size has been estimated to be approximately 100 nm, by comparison with powder from the same material produced using an orbital pulveriser for a grinding of 2 hours. No prior treatment of the silicon was applied, and it was found to have similar oxygen and hydrogen concentrations to powder produced from the Si wafers (Example 2). Nanoparticulate inks, with a 91% powder volume fraction, produced using powder milled by both methods, have similar electrical characteristics, being n-type with a resistivity of 2.2 M$\Omega$ cm.

Hall Effect Data for the different types of powder produced by the methods of Examples 1 to 3, with different volume fractions of the same binder in some cases, are given in Table 1 below.

TABLE 1

| Nanopowder | Particle Vol. Fraction | Resistivity M$\Omega$ cm | Mobility × $10^{-4}$ cm$^2$ V$^{-1}$ s$^{-1}$ | Carrier concentration × $10^{16}$ cm$^{-3}$ |
|---|---|---|---|---|
| 60 nm gas decomposition (Ex. 1) | 92% | 0.67 | 2.8 | 3.3 |
| n-type Si | 88% | 0.26 | 1.6 | 14.9 |
| n-type Si | 90% | 0.29 | 1.9 | 11.1 |
| n-type Si | 92% | 0.32 | 1.2 | 17 |
| p-type Si | 88% | 13 | 0.12 | 0.86 |
| p-type Si | 90% | 15.5 | 0.15 | 0.28 |
| p-type Si | 92% | 16.2 | 0.45 | 0.41 |
| nm metallurgical Si | 91% | 2.22 | 0.65 | 4.3 |

Potential applications for the invention include single electron devices (quantum dots); photonic arrays; electroluminescent materials and dye sensitised solar cells (DSC). Further applications include organic and inorganic semiconductor inks, printed semiconductor layers and printed devices. Depending on the application, single particles may be dispersed randomly in a matrix (quantum dots, OLEDs, DSC cells, organic semiconducting inks), regularly arranged (photonic arrays), or form an interconnecting structure (inorganic semiconducting inks). The latter may be a close packed structure, random network or a fractal agglomeration of different sized clusters.

The invention claimed is:

1. A nanoparticle comprising (a) a single element selected from Groups II, III, IV, V, or VI, or (b) a compound comprising one or more elements selected independently from Groups II, III, IV, V, and VI, wherein the nanoparticle ranges in size from 1 nm to 500 nm, and has a surface comprising a stable passivation layer formed from an oxide of the element or the compound, and wherein the stable passivation layer has a thickness of one monolayer or less.

2. The nanoparticle of claim 1, where the nanoparticle ranges in size from 30 nm to 200 nm.

3. A plurality of nanoparticles of claim 2, where the plurality of nanoparticles has an average diameter of approximately 60 nm.

4. A plurality of nanoparticles of claim 1, wherein the plurality of nanoparticles has a distribution of sizes that ranges from 20 nm to 400 nm, with a median maximum dimension of approximately 200 nm.

5. A plurality of nanoparticles of claim 1, where the plurality of nanoparticles has an average size of approximately 100 nm.

6. The nanoparticle of claim 1, where the nanoparticle comprises intrinsic silicon.

7. The nanoparticle of claim 1, wherein the nanoparticle comprises metallurgical grade silicon.

8. The nanoparticle of claim 1, where the nanoparticle comprises doped silicon.

9. The nanoparticle of claim 8 wherein the silicon is doped with a Group V or VI element and has n-type properties.

10. The nanoparticle of claim 9 wherein the silicon is doped with antimony or phosphorous.

11. The nanoparticle of claim 8 wherein the silicon is doped with a Group II or III element and has p-type properties.

12. The nanoparticle of claim 11 wherein the silicon is doped with boron.

13. The nanoparticle of claim 1, wherein the nanoparticle comprises one or more alloys selected independently from the group consisting of Ge, GaAs, AlGaAs, GaN, InP, SiC, and SiGe alloys.

14. The nanoparticle of claim 1, wherein, the nanoparticle has at least one oxygen atom terminating at its surface.

15. The nanoparticle of claim 1, wherein the oxide is a native oxide.

16. The nanoparticle of claim 1, wherein the oxide is produced by thermal or chemical synthesis, and is subsequently modified to allow the flow of electrical charge.

17. The nanoparticle of claim 16 wherein the oxide is etched so as to reduce its thickness and/or to increase its porosity.

18. The nanoparticle of claim 16 wherein a substance is included in the oxide during synthesis thereof to give the oxide semiconducting properties.

19. The nanoparticle of claim 1 wherein the surface of the nanoparticle is partially or fully terminated with oxygen.

20. The nanoparticle of claim 1 wherein the surface of the nanoparticle is partially or fully terminated with hydroxyl (OH) groups.

21. The nanoparticle of claim 1 wherein the surface of the nanoparticle is partially or fully terminated with a combination of oxygen and hydroxyl groups.

22. A printable composition comprising the nanoparticle of claim 1 and a binder.

23. The printable composition of claim 22 wherein the binder is an inorganic binder, which is conducting, semiconducting or insulating.

24. The printable composition of claim 22 wherein the binder is a polymeric binder, which is conducting, semiconducting or insulating.

25. The printable composition of claim 22 wherein the binder is a chemically active binder having constituents which react with the material of the nanoparticle to provide the semiconducting properties thereof.

26. A composite material comprising a plurality of nanoparticles of claim 1, and a solid matrix in which the nanoparticles are dispersed.

27. The composite material of claim 26 wherein the nanoparticles are dispersed randomly in the matrix.

28. The composite material of claim 26 wherein the nanoparticles are dispersed in a regular arrangement in the matrix.

29. The composite material of claim 26, wherein the nanoparticles form an interconnecting network or compact body.

30. An active semiconducting layer or structure comprising a printable composition of claim 22 or a composite material of claim 27.

31. A semiconducting device, component or circuit element including at least one semiconducting layer or structure according to claim 30.

32. An electrical or electronic circuit or assembly of electronic components which includes at least one semiconducting device according to claim 31.

33. A method of manufacturing a plurality of nanoparticles of claim 1, the method comprising: comminuting a feedstock material comprising (a) a single element selected from Groups II, III, IV, V, or VI, or (b) a compound comprising one or more elements selected independently from one or more of Groups II, III, IV, V, and VI in the presence of oxygen, hydrogen, or both oxygen and hydrogen.

34. The method of claim 33 wherein the feedstock material comprises doped or intrinsic silicon.

35. The method of claim 33 wherein the comminution of the feedstock material is carried out in the presence of air.

36. An active semiconducting layer or structure comprising a composite material of claim 26.

* * * * *